US011485748B2

(12) United States Patent
Gudilin et al.

(10) Patent No.: US 11,485,748 B2
(45) Date of Patent: Nov. 1, 2022

(54) METHODS FOR PRODUCING LIGHT-ABSORBING MATERIALS WITH PEROVSKITE STRUCTURE AND LIQUID POLYHALIDES OF VARIABLE COMPOSITION FOR THEIR IMPLEMENTATION

(71) Applicant: JOINT STOCK COMPANY KRASNOYARSK HYDROPOWER PLANT (JSC KRASNOYARSK HPP), Divnogorsk (RU)

(72) Inventors: Evgeny Alekseevich Gudilin, Moscow (RU); Alexey Borisovich Tarasov, Moscow (RU); Andrey Andreevich Petrov, St. Petersburg (RU); Nikolai Andreevich Belich, Kaluga region (RU); Aleksei Iurievich Grishko, Volgograd (RU)

(73) Assignee: JOINT STOCK COMPANY KRASNOYARSK HYDROPOWER PLANT (JSC KRASNOYARSK HPP), Divnogorsk (RU)

( * ) Notice: Subject to any disclaimer, the term of this patent is extended or adjusted under 35 U.S.C. 154(b) by 501 days.

(21) Appl. No.: 16/475,017

(22) PCT Filed: Dec. 18, 2017

(86) PCT No.: PCT/RU2017/000946
§ 371 (c)(1),
(2) Date: Jun. 28, 2019

(87) PCT Pub. No.: WO2018/124938
PCT Pub. Date: Jul. 5, 2018

(65) Prior Publication Data
US 2019/0345177 A1    Nov. 14, 2019

(30) Foreign Application Priority Data
Dec. 29, 2016  (RU) ................................ 2016152496
Dec. 29, 2016  (RU) ................................ 2016152497

(51) Int. Cl.
| | |
|---|---|
| C07F 7/24 | (2006.01) |
| C09D 5/32 | (2006.01) |
| H01L 51/00 | (2006.01) |
| H01G 9/20 | (2006.01) |
| H01L 51/42 | (2006.01) |

(52) U.S. Cl.
CPC ............... *C07F 7/24* (2013.01); *C09D 5/32* (2013.01); *H01L 51/0077* (2013.01); *H01G 9/2059* (2013.01); *H01L 51/4213* (2013.01)

(58) Field of Classification Search
CPC ...... C07F 7/24; C07F 7/22; C07F 9/94; H01L 21/02197; H01L 45/147; H01L 28/55; Y10S 502/525; C04B 35/4682; C04B 35/4686; C04B 2235/768; C25B 11/0773; C01P 2002/34; B01J 23/002; G11C 2213/31
See application file for complete search history.

(56) References Cited

U.S. PATENT DOCUMENTS

| | | | |
|---|---|---|---|
| 2016/0268510 A1* | 9/2016 | Moon | C07F 13/00 |
| 2018/0105543 A1* | 4/2018 | Zhu | C07F 7/30 |
| 2018/0351019 A1* | 12/2018 | Zhu | H01L 51/0003 |
| 2018/0351123 A1* | 12/2018 | Saliba | H01L 51/447 |

(Continued)

FOREIGN PATENT DOCUMENTS

| | | | |
|---|---|---|---|
| CN | 104 250 723 A | 12/2014 | |
| CN | 104250723 A * | 12/2014 | |
| WO | WO-2016131376 A1 * | 8/2016 | C23C 22/02 |

OTHER PUBLICATIONS

Y. Zhao et al., The Journal of Physical Chemistry Letters, 4175-4186 (2014) (Year: 2014).*
T. Singh et al., Advanced Energy Materials, (Sep. 14, 2017) (Year: 2017).*
D. McMeekin et al., 351 Science, 151-155 (2016) (Year: 2016).*
W. Yang et al., 348 Science, 1234-1237 (2015) (Year: 2015).*
Nejand, B.A. et al. 2016 "Novel Solvent-free Perovskite Deposition in Fabrication of Normal and Inverted Architectures of Perovskite Solar Cells" Scientific Reports 6(1): 1-14.
International Search Report in International Application No. PCT/RU2017/000946, dated Jun. 12, 2018.

*Primary Examiner* — Alexander R Pagano
(74) *Attorney, Agent, or Firm* — Nixon & Vanderhye PC

(57) ABSTRACT

Organic-inorganic light-absorbing materials with perovskite structure, being used in perovskite solar cells production. The objective of the invention is to provide the possibility of obtaining perovskite using precursors that are in a liquid state without the use of additional substances and reagents. The concept of the invention is based on the fact that a light-absorbing material with perovskite structure with general formula $ADB_3$, where A stands for methylammonium $MA^+$ ($CH_3NH_3^+$), formamidinium, $FA^+$ (($NH_2$)$_2CH^+$), guanidinium Gua ($C(NH2)3+$), cesium $Cs^+$ or a mixture thereof, B stands for $Cl^-$, $Br^-$, $I^-$ or a mixture thereof, while the component D represents Sn, Pb, Bi or a mixture thereof, is obtained by mixing composition $AB\text{-}nB_2$ and a component containing D, where the component containing D is chosen from elemental Sn, Pb, Bi and/or their salts, mixtures, alloys, whereas the composition $AB\text{-}nB_2$ is deposited onto the component D followed by subsequent removal of the excessive components, n is greater than or equal to one, the component $B_2$ represents $Cl_2$, $Br_2$, $I_2$ or a mixture thereof.

8 Claims, No Drawings

(56) References Cited

U.S. PATENT DOCUMENTS

| | | | |
|---|---|---|---|
| 2019/0185495 A1* | 6/2019 | Cahen | C07F 7/2288 |
| 2019/0241802 A1* | 8/2019 | Wheeler | C07F 7/24 |
| 2020/0239499 A1* | 7/2020 | Zhu | H01L 51/0077 |
| 2020/0377532 A1* | 12/2020 | Li | C07F 7/24 |

* cited by examiner

METHODS FOR PRODUCING LIGHT-ABSORBING MATERIALS WITH PEROVSKITE STRUCTURE AND LIQUID POLYHALIDES OF VARIABLE COMPOSITION FOR THEIR IMPLEMENTATION

This application is the U.S. national phase of International Application No. PCT/RU2017/000946 filed Dec. 18, 2017, which claims priority to Russian Application No. 2016152496 filed Dec. 29, 2016 and Russian Application No. 2016152497 filed Dec. 29, 2016, the entire contents of each of which are hereby incorporated by reference.

FIELD OF THE INVENTION

The invention relates to organic-inorganic substances with variable composition, serving as an initial reagent for obtaining organic-inorganic perovskites as well as to the methods of obtaining organic-inorganic light-absorbing materials with perovskite structure, being used in perovskite solar cells production.

STATE OF THE ART

Methods of obtaining organic-inorganic light-absorbing materials with perovskite structure as well as compositions used for organic-inorganic light-absorbing materials with perovskite structure producing are known from the state of the art.

For example, methods synthesis of precursors of photoactive materials organic-inorganic perovskites, which are known from the state of the art, e.g. MAI (methylammonium iodide) and FAI (formamidinium iodide) precursors:

The published work of Qiu, Jianhang; Qiu, Yongcai; Yan, Keyou; Zhong, Min; Mu, Cheng; Yan, He; Yang, Shihe (2013), "All-solid-state hybrid solar cells based on a new organometal halide perovskite sensitizer and one-dimensional TiO2 nanowire arrays", Nanoscale, 5 (8): 3245-3248 discloses the method of MAI precursor's synthesis by mixing methylamine and hydrogen iodide (57% aqueous solution) in equimolar quantities and stirring under 0° C. during 120 minutes with subsequent rotary evaporator-based crystallization under 60° C. temperature;

In the report (Hu, M.; Liu, L.; Mei, A.; Yang, Y.; Liu, T.; Han, H. Efficient Hole-Conductor-Free, Fully Printable Mesoscopic Perovskite Solar Cells with a Broad Light Harvester NH2(CH)NH2PbI3. J. Mater. Chem. A 2014, 2 (40), 17115-17121) the method of FAI precursor synthesis by mixing formamidinium acetate and hydrogen iodide (57% aqueous solution) and stirring under 50° C. during 30 minutes with subsequent rotary evaporator-based crystallization is disclosed.

The disadvantage of the afore-mentioned precursors is that they require the use of a solvent and special reaction conditions to ensure reaction proceeding to obtain organic-inorganic perovskite because they are solid-state materials and thus complicate technological process, increase production and environmental risks and have a negative impact on the health of employees, involved in organic-inorganic perovskite production process.

Moreover, methods of synthesis of liquid at room temperature polyiodides are known from the state of the art:

In the report of Stegemann, H.; Rohde, A.; Reiche, A.; Schnittke, A.; Füllbier, H. Room Temperature Molten Polyiodides. Electrochim. Acta 1992, 37 (3), 379-383 method of synthesis of polyiodides $CH_3(CH_3CH_2)_3I_5$ by making $CH_3(CH_3CH_2)_3I$ out of triethylamine and methylammonium iodide in isopropanol and subsequent mixing of $CH_3(CH_3CH_2)_3I$ with iodine, as well as similar methods for synthesis of polyiodides $(Oc)_4I_5$, $(Oc)_4I_7$ and $(Oc)_4I_9$ is disclosed.

The disadvantage of afore-mentioned polyiodides is the use of cations which are not suitable for obtaining light-absorbing material for perovskite solar cells.

The methods of obtaining perovskites $CH_3NH_3PbI_3$ and $CH_3NH_3PbBr_3$, which are known from the state of the art, are the closest to the claimed technical solution.

The patent CN104250723, Sep. 9, 2014, Zhi Zheng, Cheng Camry, Lei Yan, Jia Huimin, Ho Wei Wei, He Yingying "Chemical method for in-situ large-area controlled synthesis of perovskite type $CH_3NH_3PbI_3$ membrane material based on lead simple-substance membrane" discloses a method of synthesis of perovskite $CH_3NH_3PbI_3$ by means of dipping of the metallic lead into solution of iodine and methylammonium iodide in organic solvent, for example, ethanol.

The patent CN105369232, Feb. 16, 2015, Zhi Zheng, He Yingying, Lei Yan, Cheng Camry, Jia Huimin, Ho Wei Wei, "Lead-based perovskite-type composite elemental thin-film in-situ wide area control $CH_3NH_3PbBr_3$ film material chemical method" describes a method of synthesis of perovskite $CH_3NH_3PbBr_3$ by dipping metallic lead into solution of methylammonium bromide in organic solvent, for example isopropanol.

The disadvantage of the above-mentioned methods is the mandatory use of solvent, that complicates the process of organic-inorganic perovskite formation and leading to production-related, environmental and health risks. Thus organic-inorganic compounds with variable composition serving as a liquid at room temperature starting reagent for obtaining organic-inorganic perovskites as well as the methods of obtaining organic-inorganic light-absorbing materials with perovskite structure, being used in perovskite solar cells production are warranted.

The Objective of the claimed technical solution is the development of simple, quick and low-waste method of obtaining organic-inorganic light-absorbing materials with perovskite structure in a solvent-free way as well as the synthesis of a composition to be used for afore-said methods implementation, which allows obtaining materials suitable for the use in solar cells.

The technical outcome, to be achieved as a result of application of the claimed invention, is the simplification and acceleration of obtaining organic-inorganic light-absorbing materials with perovskite structure, including organic-inorganic perovskites and perovskite-like compounds containing Pb, Sn, Bi, in a solvent-free way, particularly, at room temperature, with capability of the use of the obtained materials in solar cells.

The technical result in the realization of the method is achieved by the fact that a material with perovskite structure can be obtained by mixing two reagents Realization of the method enables technical outcome achievement, owing to the fact that the material with perovskite structure can be obtained by mixing two reagents $AB-nB_2$ and D with subsequent elimination of the excessive reagents, where the first reagent is a variable composition $AB-nB_2$, where n≥1, A stands for methylammonium $MA^+$ $(CH_3NH_3^+)$, formamidinium, $FA^+$ $((NH_2)_2CH^+)$, guanidinium Gua $(C(NH_2)_3^+)$, cesium $Cs^+$ or a mixture thereof, B stands for $Cl^-$, $Br^-$, $I^-$ or a mixture thereof, whereas $Cl_2$, $Br_2$, $I_2$ or a mixture thereof can be used as component $B_2$, while the second reagent D is chosen from elemental Sn, Pb, Bi and/or their salts, mixtures, alloys.

Methods for bringing together the components AB-nB$_2$ and D can be different: dip-coating—dropping one substance onto another or immersing the substance D in the composition AB-nB$_2$, spray-coating—spraying one substance onto another, spin coating—applying one substance in a liquid state on a rotating substrate with another substance, doctor blade—applying one substance onto another by means of a dosing blade, roll-to-roll—roll-to-roll technology of application of substances, screen printing—screen printing of the substance AB-nB$_2$ on the surface of the substance D.

Excess of the component B (Cl, Br, I) can be removed by one of the following methods: washing in a solvent, dropping the solvent on the surface, annealing at an elevated temperature, evaporation under reduced pressure, using a substance that absorbs component B$_2$.

The technical result in case of using the composition and the method for its preparation is achieved by mixing the two solid components AB and B$_2$ in the form of powders to obtain a liquid composition AB-nB$_2$ of variable composition with various molar ratios of the components AB and B$_2$, where n≥1, A stands for methylammonium MA$^+$ (CH$_3$NH$_3^+$), formamidinium, FA$^+$ ((NH$_2$)$_2$CH$^+$), guanidinium Gua (C(NH$_2$)$_3^+$), cesium Cs$^+$ or a mixture thereof, B stands for Cl$^-$, Br$^-$, I$^-$ or a mixture thereof, whereas B$_2$ stands for Cl$_2$, Br$_2$, I$_2$ or a mixture thereof.

The main feature of a new composition for light absorbing material with perovskite structure preparation which can be used for implementation of the process according to the invention is its quick and simple production without the use of a solvent according to the following reaction: AB-nB$_2$+D=ADB$_3$+(n−1)B$_2$.

A more general approach to produce a light absorbing material with perovskite structure and chemical formula ADB$_3$ (wherein A is chosen from the cations CH$_3$NH$_3^+$, (NH$_2$)$_2$CH$^+$, C(NH$_2$)$_3^+$, Cs$^+$ and the mixtures of thereof, B is chosen from the from the anions Cl$^-$, Br$^-$, I$^-$ or mixtures of thereof and D is chosen from elements Sn, Pb, Bi or mixtures of thereof) is to mix the composition AB-nB$_2$ and reagent that contains D, wherein the component that contains D is chosen from elemental Sn, Pb, Bi and/or their salts, mixtures, alloys, B is chosen from Cl$_2$, Br$_2$, I$_2$ and mixtures of thereof, for which, the reactant with the composition AB-nI$_2$ (n≥1) is brought into contact with the component D and the excess of this composition is removed.

Moreover, the mixing of the composition AB-nB$_2$ with the reagent that contains D is performed by means of dissolution of D in the mixture that contains components A and B with a consequent thermal treatment or the mixing of the composition AB-nB$_2$ with the reagent that contains D is performed by means of dissolution of D in the mixture that contains components A and B with a consequent pressure decrease or the mixing of the composition AB-nB$_2$ with the reagent D is performed by means of dissolution of D in the mixture that contains components A, B and D with the consequent with a consequent thermal treatment or the mixing of the composition AB-nB$_2$ with the reagent D is performed by means of dissolution of D in the mixture that contains components A, B and D with a consequent pressure decrease.

Furthermore, the mixing of reagents AB-nB$_2$ and the reagent that contains D can be performed by means of any of the methods listed below or a combination thereof: spin-coating, spray-coating, immersion, blade coating, drop-casting, roll-to-roll deposition, screen printing, while the excess of the component B from the composition AB-nB$_2$ is removed by means of any of the methods listed below or a combination thereof: washing with a solvent, thermal treatment of the substrate, removal under the reduced pressure, removal using sorbent.

In a particular embodiment of the process, the method for preparation of a liquid reagent for the fabrication of an organic-inorganic perovskite is to mix the components that contain cations A and B within the temperature range from 0 to 150° C. that results in the formation of the mixture AB-nB$_2$, (n≥1), wherein A is chosen from CH$_3$NH$_3^+$, (NH$_2$)$_2$CH$^+$, C(NH$_2$)$_3^+$, or mixture of thereof, B is chosen from Cl$^-$, Br$^-$, I$^-$ anions or mixture of thereof, as well as a mixture of these components with Cs$^+$ ions while the A to B ratio lies within the range from 1:1 to 1:5.

Below the particular embodiments of the fabrication of the light absorbing material with a perovskite structure with the general formula ADB$_3$ are provided.

Information on the application of the claimed method for obtaining a perovskite solar cell is given as an example of a specific implementation.

EXAMPLE 1

A reagent MAI-2I$_2$ is obtained by mixing 159 mg MAI and 508 mg I$_2$ which is then spin-coated on top of the substrate of the following configuration: FTO/TiO$_2$/Pb with a metallic lead layer 250 nm thick (FTO stands for fluorine-doped tin oxide). The substrate is then heated and kept at a temperature of 115° C. for 30 minutes. As a result, a perovskite layer MAPbI$_3$ is formed on the substrate.

EXAMPLE 2

A powder of metallic lead (20 mg) is added to the reagent AB-nB$_2$ (A=MA; B=I, Br; n≥1) that is obtained by mixing 127 mg MAI, 22 mg MABr, and 508 mg I$_2$ and this mixture is stirred for 12 hours. The mixture is then filtered using the syringe filter (PTFE, 0.45 μm pore-diameter) and spin-coated on top of metallic lead 50 nm-thick on glass substrate. After the spin-coating process, the substrate is immersed into the isopropanol bath, removed and dried. As a result, a perovskite layer MAPbI$_x$Br$_{3-x}$ is formed on the glass substrate.

EXAMPLE 3

A reagent AB-nB$_2$ (A=MA, FA; B=I, Br; n≥1) is obtained by mixing FAI (137 mg), MABr (22 mg) and I$_2$ (508 mg) which is then spin-coated on top of metallic lead 250 nm-thick on glass substrate. Just 15 seconds before the rotation of the sample-holder ends, 100 μl of the isopropyl alcohol is dropped onto the surface of the sample. As a result, a perovskite layer MA$_x$FA$_{1-x}$PbI$_{3y}$Br$_{3-3y}$ (0≤x≤1; 0≤y≤1) is formed on the glass substrate.

See below the ways of preparation of liquid polyhalides composition with a general formula AB-nB$_2$.

EXAMPLE 4

1016 mg (4 mmol) of crystalline iodine in the form of a solid powder is added at room temperature to 318 mg (2 mmol) of crystalline MAI in the form of a solid powder. After that, the mixture is stirred for 3 minutes at room temperature, resulting in the formation of a dark brown liquid with a composition MAI-2I$_2$. After preparation, the composition retains its properties for at least a month at room temperature.

EXAMPLE 5

1270 mg (5 mmol) of crystalline iodine in the form of a solid powder is added at room temperature to 318 mg (2 mmol) of crystalline MAI in the form of a solid powder. After that, the mixture is stirred for 3 minutes at 40° C. and cooled down to room temperature, resulting in the formation of a dark brown liquid with a composition MAI-2.5I$_2$. After preparation, the composition retains its properties for at least a month at room temperature.

EXAMPLE 6

2540 mg (10 mmol) of crystalline iodine in the form of a solid powder is heated in a closed vial up to 120° C. which causes iodine melting. Then, 318 mg (2 mmol) of crystalline MAI in the form of a solid powder is added in the vial. After that, the mixture is stirred for 3 minutes and cooled down to 70° C., resulting in the formation of dark brown liquid with a composition MAI-5I$_2$. After preparation, the composition retains its properties for at least a month at 70° C.

The invention claimed is:

1. A method for producing a light absorbing material with perovskite structure and chemical formula ADB$_3$, the method comprising:
   mixing a composition that comprises AB-nB$_2$ with a reagent that comprises component D to yield ADB$_3$ and removing excess component D,
   wherein:
   A is selected from the group of cations consisting of: CH$_3$NH$_3^+$, (NH$_2$)$_2$CH$^+$, C(NH$_2$)$_3^+$, Cs$^+$ and mixtures of thereof,
   B is selected from the group of anions consisting of: Cl$^-$, Br$^-$, I$^-$ and mixtures of thereof,
   B$_2$ is an elemental halogen selected from the group consisting of: Cl$_2$, Br$_2$, and I$_2$, or a mixture thereof, and
   D is selected from the group of elements consisting of: elemental Sn, Pb, Bi and mixture, alloys and salts thereof.

2. The method according to claim 1, wherein the mixing of the composition AB-nB$_2$ with the reagent that comprises component D is performed by dissolving the reagent that comprises component D in the composition that comprises AB-nB$_2$ with a consequent thermal treatment.

3. The method according to claim 1, wherein the mixing of the composition AB-nB$_2$ with the reagent that comprises component D is performed by dissolving the reagent that comprises component D in the composition that comprises AB-nB$_2$ with a consequent pressure decrease.

4. The method according to claim 1, wherein the mixing of the composition AB-nB$_2$ with the reagent that comprises component D is performed by dissolving the reagent that comprises component D in a mixture that contains components A, B and D with a consequent thermal treatment.

5. The method according to claim 1, wherein the mixing of the composition AB-nB$_2$ with the reagent that comprises component D is performed by dissolving D in a mixture that contains components A, B and D with a consequent pressure decrease.

6. The method according to claim 1, wherein the mixing of the composition AB-nB$_2$ with the reagent that comprises component D is performed by depositing AB-nB$_2$ on the reagent that comprises component D.

7. The method according to claim 6, wherein the deposition of AB-nB$_2$ on the reagent that comprises component D is performed by any of the following or a combination thereof: spin-coating, spray-coating, immersion, blade coating, drop-casting, roll-to-roll deposition or screen printing.

8. The method according to claim 1, wherein an excess of component B from the composition AB-nB$_2$ is removed by any of the following methods or a combination thereof: washing with a solvent, thermal treatment of the substrate, removal under the reduced pressure or removal using sorbent.

* * * * *